(12) United States Patent
Sommer et al.

(10) Patent No.: US 6,434,725 B1
(45) Date of Patent: Aug. 13, 2002

(54) METHOD AND SYSTEM FOR SEMICONDUCTOR TESTING USING YIELD CORRELATION BETWEEN GLOBAL AND CLASS PARAMETERS

(75) Inventors: Michael Bernhard Sommer, Richmond; Larry Broach, Earlyville, both of VA (US); Herbert Lammering, Munich (DE)

(73) Assignees: Infineon Technologies Richmond, LP; White Oak Semiconductor Partnership, both of Sandston, VA (US)

(*) Notice: Subject to any disclaimer, the term of this patent is extended or adjusted under 35 U.S.C. 154(b) by 212 days.

(21) Appl. No.: 09/603,592

(22) Filed: Jun. 26, 2000

(51) Int. Cl.[7] ............................................. G06F 17/50
(52) U.S. Cl. ............................... 716/4; 716/19; 702/84
(58) Field of Search ....................... 716/1–21; 382/145; 438/14; 700/110; 702/34; 703/13, 14; 324/765; 345/519; 257/181; 902/26

(56) References Cited

U.S. PATENT DOCUMENTS 5,319,570 A * 6/1994 Davidson et al. .............. 716/4
5,777,901 A * 7/1998 Berezin et al. ................ 716/19
5,793,650 A * 8/1998 Mirza ........................... 702/34
5,835,384 A * 11/1998 Lin ............................... 702/84
5,841,893 A * 11/1998 Ishikawa et al. ............ 382/145
5,923,553 A * 7/1999 Yi ............................... 700/110
6,017,771 A    1/2000 Yang et al.
6,210,983 B1 * 4/2001 Atchison et al. .............. 438/14
6,327,556 B1 * 12/2001 Geiger et al. ................ 703/13

* cited by examiner

Primary Examiner—Matthew Smith
Assistant Examiner—Helen Rossoshek
(74) Attorney, Agent, or Firm—Stanton Braden

(57) ABSTRACT

A method for yield correlation for semiconductor chips, in accordance with the present invention, includes providing test data for a plurality of tests on each of a plurality of semiconductor chips. A global parameter is assigned to each chip as a quality measure based on the test data for that chip. Values for a plurality of parameter classes are determined, and each parameter class represents a parameter measured for each chip tested. A correlation between the values of the parameter classes and the global parameter values for the plurality of chips is then determined. The correlation for each of the parameter classes is compared to identify at least one parameter class, which detracts from chip yield.

26 Claims, 2 Drawing Sheets

METHOD AND SYSTEM FOR SEMICONDUCTOR TESTING USING YIELD CORRELATION BETWEEN GLOBAL AND CLASS PARAMETERS

BACKGROUND

1. Technical Field

This disclosure relates to semiconductor testing, and more particularly, to a method for analyzing test results for test failure data to correlate failures to physical processes.

2. Description of the Related Art

Semiconductor testing is typically performed by generating a data test pattern of 1's and 0's. The pattern may be scrambled by altering addresses of the data to be stored in a memory array. Then, the data is retrieved from the memory array and compared to the original data. Any discrepancies of data are considered a fail. Otherwise, the tested cells pass. The test results are then output and stored to create, for example, a bit map. The data output is typically compressed data. In other words, pass/fail (1 or 0) results are output and logically combined to reduce the data set. Once all the data is available for a given semiconductor wafer, a yield value is assigned to the wafer to designate its overall quality. Yield is often expressed as a percentage designated by devices, which passed testing, divided by a total number of devices tested (times 100).

Yield provides a single value, which describes the quality of a wafer (or chip) and gives a level of confidence for the reliability of a given wafer. However, yield is one-dimensional and fails to provide insight as to why failures have occurred. Yield problems are in general not easy to be correlated to a root cause. A mathematical correlation between failures and yield is difficult.

In some instances, an assumption may made that yield is down due to the identification of failures by a particular test. Correlating the fail count to a certain parameter may result in changes that reduce the fail count for that particular test, but may also cause a different test to pick up more fails.

Therefore, a need exists for a correlation parameter, which provides information about the quality of a chip while also indicating a root cause for failures.

SUMMARY OF THE INVENTION

A method for yield correlation for semiconductor chips, in accordance with the present invention, includes providing test data for a plurality of tests on each of a plurality of semiconductor chips. A global parameter is assigned to each chip as a quality measure based on the test data for that chip. Values for a plurality of parameter classes are determined, and each parameter class represents a parameter measured for each chip tested. A correlation between the values of the parameter classes and the global parameter values for the plurality of chips is then determined. The correlation for each of the parameter classes is compared to identify at least one parameter class, which detracts from chip yield.

A method for yield correlation for semiconductor chips, in accordance with the invention, includes providing test data for a plurality of tests on each of a plurality of semiconductor chips. A global parameter is assigned to each chip as a quality measure based on the test data for that chip and based on failures and measurements made for each chip. Values for a plurality of parameter classes are determined, and each parameter class represents a parameter measured for each chip tested. A single value is provided for each parameter class for each chip, and a correlation between all of the single values of the parameter classes for each chip and the global parameter values for each chip of the plurality of chips is determined. The correlation for each of the parameter classes are compared to identify at least one parameter class which detracts from chip yield. Processes are identified which are responsible for yield detraction based on the at least one parameter class.

In other methods, the step of assigning a global parameter to each chip may include the step of analyzing the test data for all the tests to determine the global parameter for each chip. The step of assigning a global parameter to each chip may include the steps of assigning an initial global parameter based on test results of one test and modifying the initial global parameter based on test results of other tests. The step of assigning a global parameter to each chip may include the step of employing a mathematical formula for calculating the global parameter.

In still other methods, the step of assigning a global parameter to each chip may include the step of considering the severity of test results to modify the global parameter. The step of assigning a global parameter to each chip may include the step of weighting the global parameter based on a test type. The step of determining values for a plurality of parameter classes may include measuring parameters on each chip and combining the measured parameters into a single number. The step of determining a correlation between the values may include the step of computing a correlation coefficient for each parameter class. The method may further include the step of eliminating from consideration parameter classes having the correlation coefficient less than a threshold value.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a method for characterizing semiconductor chips by generating a global parameter, which indicates quality of a chip. By employing this global parameter a correlation may be made between the quality of the chip and test parameters measured during wafer/chip testing. This correlation will identify specific characteristics, which can be improved to improve chip quality. The present invention will be described generally for a global parameter and its use for a plurality of illustrative tests. The present invention should not be construed as limited by the values of the global parameter and/or the tests set forth herein.

Figure 1:
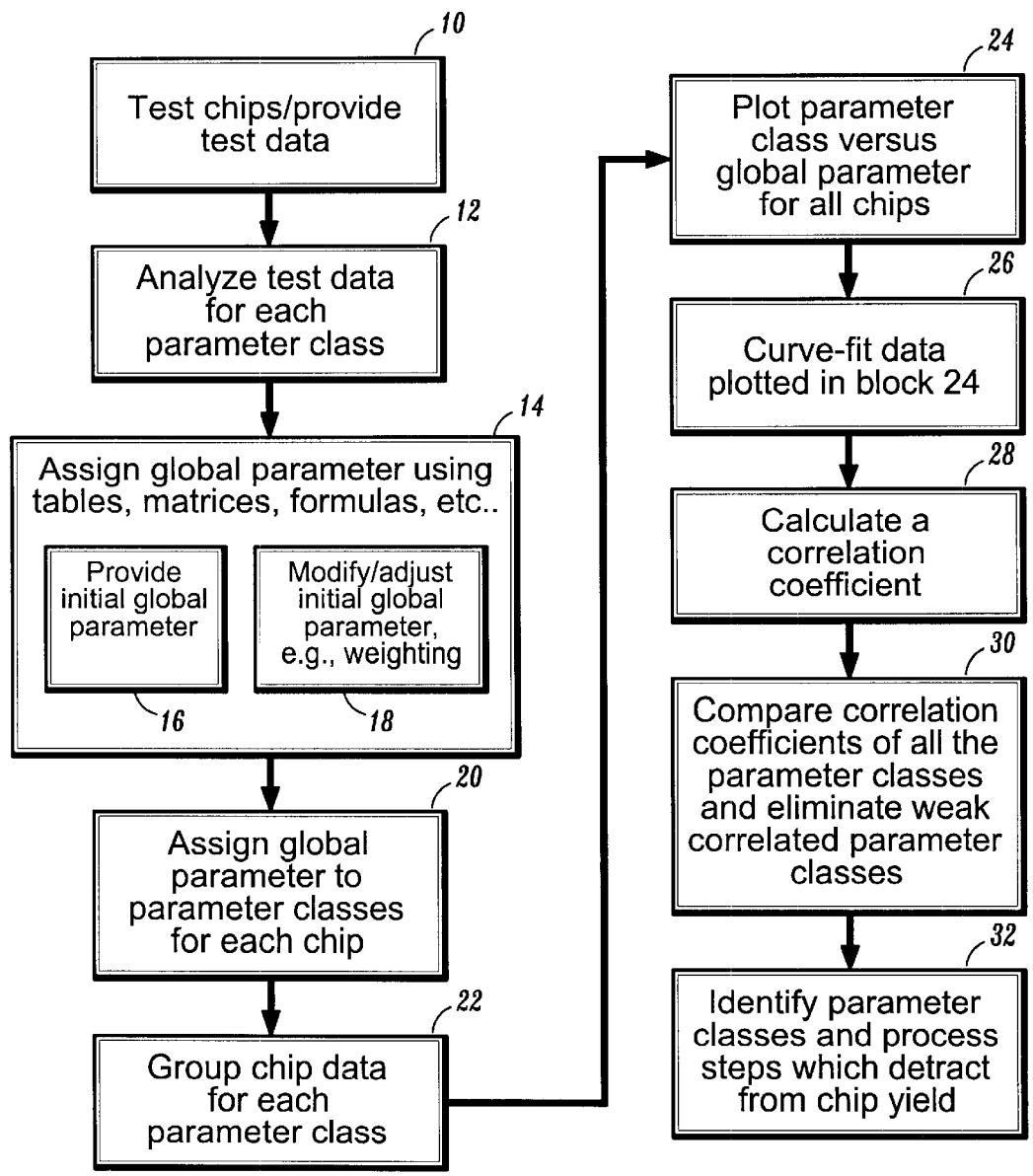
FIG. 1 is a flow/block diagram showing a method/system for providing yield correlation by employing a global parameter in accordance with the present invention.

It should be understood that the elements shown in FIG. 1 may be implemented in various forms of hardware, software or combinations thereof. Preferably, these elements are implemented on one or more appropriately programmed general purpose digital computers having a processor and memory and input/output interfaces. It should be further understood the methods of the present invention may be fully automated by providing a program storage device readable by machine, and tangibly embodying a program of instructions executable by the machine to perform the method steps for yield correlation.

Referring now in specific detail to the drawings in which like reference numerals identify similar or identical elements throughout the several views, and initially to FIG. 1, a block/flow diagram for describing a system and method for characterizing wafers is illustratively shown. In block 10, a semiconductor wafer is tested. Semiconductor wafer testing includes a plurality of different tests, which are employed to measure different parameters. Generally, semiconductor memory testing includes direct current tests also known in the art as electrical tests, to identify electrical characteristics of chips disposed on a wafer. These electrical tests include circuit performance tests. After electrical tests are performed, functional tests, for example, retention tests are performed for determining retention time for stored charge in memory cells of the chips. Then, timing tests are performed to access the delay characteristics of the device/circuits of the chips. Repairs are made to failed devices after these tests to ensure that a high quality product is produced.

Semiconductor testing may include a plurality of tests, for example, 50 or more tests. Each test has failures or measurements associated with it. This failure data is collected and analyzed in block 12. The analysis of the test data and measurements includes organizing or characterizing test-result data. For example, if tests include measuring sheet resistance for metal layer M1, a characteristic value or range of values is provided to represent the test result. In the example of sheet resistance, a resistance value of say, 2 Ohms is provided. This is performed for each of the plurality of tests performed in block 10. In one embodiment, the test data for each parameter class of tests is reduced to a single characteristic value for a given chip for that parameter class.

In block 14, given the test data in block 10 and/or block 12, a global parameter is assigned to each chip. The global parameter is assigned based on the testing results and in sensitive to the types of tests. For example, the global parameter is assigned to each chip based on, for example, all available test data, a number of failures for a given test, types of failures for a given test or an overall judgement of the chip's overall quality.

In one embodiment, a global value is assigned based on the results of all tests and measurements. A complex lookup table or mathematical equation may be employed to weight and evaluate the data to assign a global value. Weighting may be provided based on the type of test, the importance of the test, the ranges of measurements obtained, etc. Weighting may also be made adjustable based on a number of failures or individual test conditions. In the illustrative example, which follows, a global parameter is assigned by selecting a test or series of tests to provide an initial or baseline global parameter value. A higher value in this example corresponds to poor test results. Global values may be selected or adjusted based on engineering judgment, based on a lookup table or matrix or by employing a formula where the inputs include test/measurement results. Table 1 shows an illustrative example of a matrix for selecting an initial global value.

In this example, failures or measurements are divided into ranges. In a preferred embodiment, objective criteria are generated for assigning a global parameter value to a chip.

Table 1 shows a simplified matrix for assigning a global value to a chip having failures or measurements in four discrete ranges. For example, range 1 may include 30% or more failures, range 2 may include 20–29% failures, range 3 may include 10–19% failures, and range 4 may include 0–9% failures. Since electrical tests generally have more weight than other tests the global parameter is assigned an initial value based the test results/measurements of this test. Other tests may also be employed to assign an initial global parameter value.

TABLE 1

| Test | Fail or measurement range 1 | Fail or measurement range 2 | Fail or measurement range 3 | Fail or measurement range 4 |
|---|---|---|---|---|
| Electrical Tests | Global parameter = 25 | Global parameter = 20 | Global parameter = 15 | Global parameter = 10 |

As shown in Table 2, modifiers for the global parameter may be employed to adjust the initial global value assigned in Table 1. These modifiers may be in a form, which permits addition/subtraction to the global parameter, or provide a multiplier to the global parameter or a combination of both. From Table 1, if a chip had electrical failures in range 2, a global parameter of 20 would be assigned. If the same chip had failures in the retention tests in range 3 and in the timing tests in range 4, the global parameter would be modified by +8 and +2, respectively. This makes the global parameter 20+8+2=30. Other initial global parameter values and modifiers may be employed.

TABLE 2

| Test | Fail or measurement range 1 | Fail or measurement range 2 | Fail or measurement range 3 | Fail or measurement range 4 |
|---|---|---|---|---|
| Retention Tests | +10 | +8 | +6 | +4 |
| Timing Tests | +5 | +4 | +3 | +2 |

Block 14 includes the steps of assigning and modifying the global parameter. For example, block 16 provides an initial global parameter value and block 18 modifies the global parameter value in accordance with other tests or factors. It is noted that a global parameter value may be selected based on simpler or more complex criteria. For example, a global value may be based on a single number which is assigned based on the test data of a single test sequence or based on an engineer's assessment of the effect of failures/measurements on the quality of a chip. In another example, modifiers may be employed for each of a plurality of individual tests, such as, e.g., parasitic capacitance tests, sheet resistance tests, contact resistance tests, threshold voltage tests, and/or any other tests known in the art.

In block 20, global parameter values for each chip tested on a wafer or a plurality of wafers are assigned to each parameter tested. For example, a chip with a global parameter value of 30 is matched up with each test parameter class. Test parameter classes include numerical data derived from the plurality of tests/measurements performed on the chips. Test parameter classes include measurements, such as for example, sheet resistance values for metal layer M1, contact resistance for M0 level contacts, the width of a M1 layer metal paths, threshold voltages of transistors, or any other measured parameter. Table 3 shows an illustrative assignment of global parameter values.

TABLE 3

Parameter classes with values for a single chip.

| Parameter class | Value of parameter | Global parameter |
|---|---|---|
| Sheet resistance M1 | 3.5 Ohms | 30 |
| Threshold voltage | 800 mV | 30 |
| Other tests . . . | Other values . . . | 30 |

In Table 3, parameter classes are a result of desired test measurements during testing (see block 10) and parameter values are a result of analysis (block 12). Table 3 is generated for each chip for all parameter values. The global parameter value for that individual chip is assigned to all parameter values for that individual chip. Now a mathematical correlation may be performed.

In block 22, data for each parameter class is grouped for a group of chips, e.g., all chips in a lot, all chips on a wafer or all chips on a plurality of wafers, etc. A matrix may be formed where an X coordinate represents the parameter value for a given chip and the Y coordinate represents the global parameter value for that chip (or vice versa). Table 4 illustratively shows such a matrix for sheet resistance of metal layer M1.

TABLE 4

| Chip | Parameter Value | Global parameter |
|---|---|---|
| Chip A | 4 Ohms | 30 |
| Chip B | 3.5 Ohms | 21 |
| Chip C | 3.75 Ohms | 18 |
| Chip D | 2.5 Ohms | 4 |
| . . . | . . . | . . . |

Figure 2:
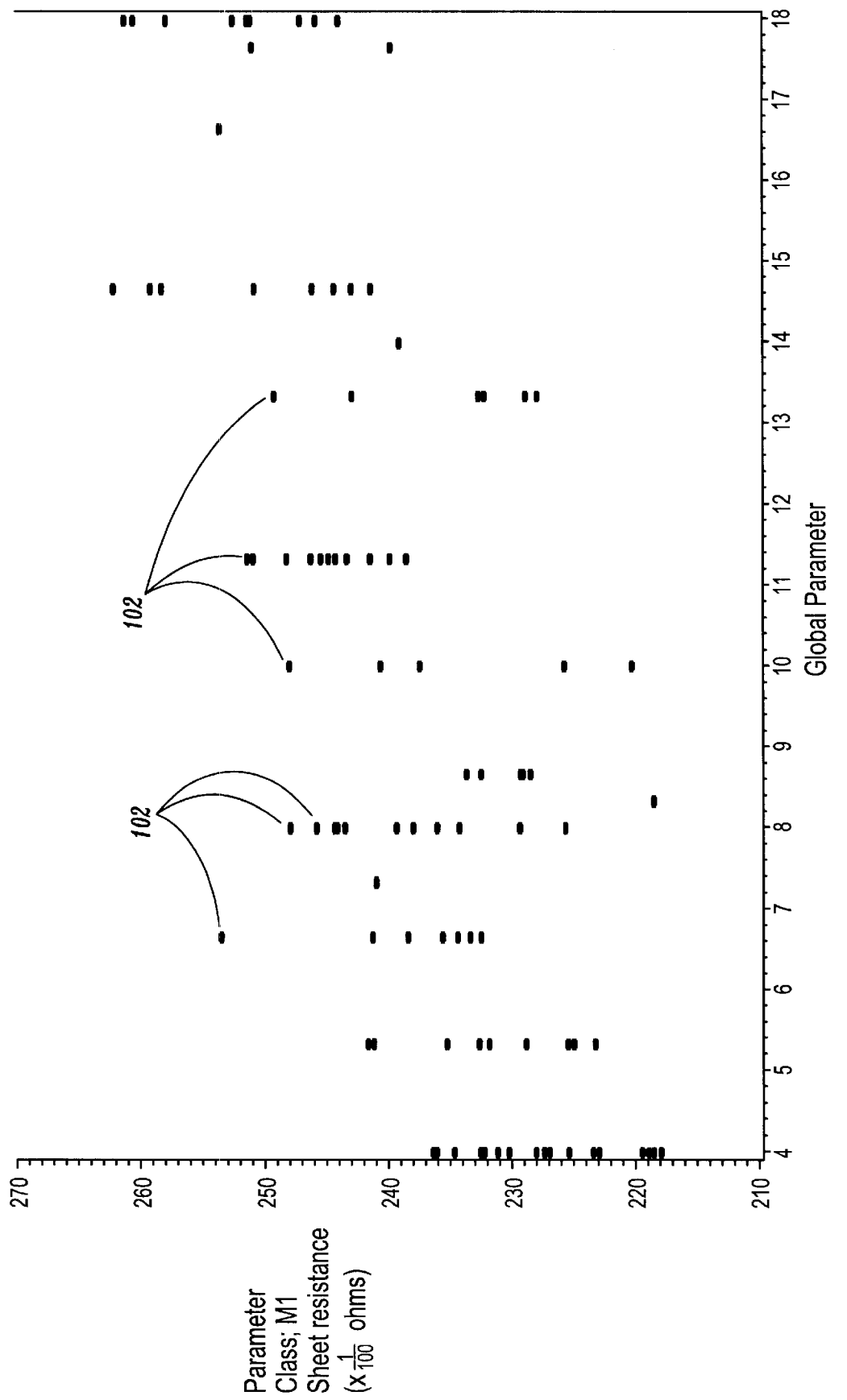
FIG. 2 is an illustrative plot of a parameter value for a plurality of chips versus a global parameter value for the chips in accordance with the present invention.

Table 4 is preferably generated for each parameter class, or each desired parameter class. In block 24, the data of each Table 4 may be graphically plotted, as shown in FIG. 2. FIG. 2 is an illustrative plot of the parameter class of sheet resistance of metal layer M1. Each point 102 represents a different chip. The x-axis represents the global parameter value and the y-axis represents sheet resistance in Ohms. This may be performed to provide a graphical tool for analyzing the data. A plot, as in FIG. 2, may be provided for each parameter class.

Optionally, in block 26, a best curve may be fitted to the data plotted in block 24 to determine a trend or relationship between the global parameter, which measures the quality of the chips and the parameter class. This may include linear or non-linear curve-fitting techniques.

In block 28, a correlation coefficient is calculated for each parameter class (e.g., for each matrix as shown in Table 4). In this way, a correlation between the global parameter and the particular parameter class are quantified. A correlation coefficient may be calculated for a linear relationship by employing a correlation coefficient formula known in the art. In one embodiment, the correlation coefficient is calculated by:

$$r = \frac{\sum (x_i - \bar{x})(y_i - \bar{y})}{\sqrt{\sum (x_i - \bar{x})^2 \cdot \sum (y_i - \bar{y})^2}}$$

where $x_i$ and $y_i$ are the parameter value for a given parameter class and the global parameter value (or vice versa) for the $i^{th}$ chip, and $\bar{x}$ and $\bar{y}$ are mean values for x's and y's values respectively. r returns a value between −1 and 1, where −1 is a perfect negative correlation and 1 is a perfect positive correlation.

In block 30, by generating r for each parameter class for all the chips, a correlation coefficient is available for comparison of each parameter class. The absolute value of the correlation coefficients is taken. The correlation coefficients may now be compared to a threshold value, for example, 0.4, although other threshold values may be employed, to eliminate weaker correlations from consideration. Each correlation coefficient calculated represents a parameter class. When the correlation coefficient is eliminated so is the associated parameter class. Remaining parameter classes are now considered.

In block 32, by considering the parameter class with the highest correlation or correlations, it is now possible to associate a failure type, failure mechanism or measurement to chips to identify possible reasons for the yield of the chip. The most significant correlation coefficient reveals the root cause for the most severe yield detractor.

The invention brings a sort category to a unit to execute mathematical procedures. These procedures may be able to extract parameter classes that correlate in a positive or negative way to the sort yield or any other sort category. Arranging the sort categories in an order that provides linear relationship allows a mathematical approach to detect the best correlation. In block 34, correlation data and global parameter data may be stored and employed over time to better understand yield detraction. This step includes identifying process fabrication steps that are responsible for the detracted yield.

Having described preferred embodiments for yield correlation using a global parameter (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for yield correlation for semiconductor chips, comprising the steps of:

providing test data for a plurality of tests on each of a plurality of semiconductor chips;

assigning a global parameter to each chip as a quality measure based on the test data for that chip;

determining values for a plurality of parameter classes, each parameter class representing a parameter measured for each chip tested;

determining a correlation between the values of the parameter classes and the global parameter for each chip of the plurality of chips; and comparing the correlation for each of the parameter classes to identify at least one parameter class, which detracts from chip yield.

2. The method as recited in claim 1, wherein the step of assigning a global parameter to each chip includes the step of analyzing the test data for all the tests to determine the global parameter for each chip.

3. The method as recited in claim 1, wherein the step of assigning a global parameter to each chip includes the steps of:
   assigning an initial global parameter based on test results of one test; and
   modifying the initial global parameter based on test results of other tests.

4. The method as recited in claim 1, wherein the step of assigning a global parameter to each chip includes the step of employing a mathematical formula for calculating the global parameter.

5. The method as recited in claim 1, wherein the step of assigning a global parameter to each chip includes the step of considering the severity of test results to modify the global parameter.

6. The method as recited in claim 1, wherein the step of assigning a global parameter to each chip includes the step of weighting the global parameter based on a test type.

7. The method as recited in claim 1, wherein the step of determining values for a plurality of parameter classes includes measuring parameters on each chip and combining the measured parameters into a single number.

8. The method as recited in claim 1, wherein the step of determining a correlation includes the step of computing a correlation coefficient for each parameter class.

9. The method as recited in claim 8, further comprising the step of eliminating from consideration parameter classes having the correlation coefficient less than a threshold value.

10. A method for yield correlation for semiconductor chips, comprising the steps of:
    providing test data for a plurality of tests on each of a plurality of semiconductor chips;
    assigning a global parameter to each chip as a quality measure based on the test data for that chip based on failures and measurements made for each chip;
    determining values for a plurality of parameter classes, each parameter class representing a parameter measured for each chip tested;
    providing a single value for each parameter class for each chip;
    determining a correlation between all of the single values of the parameter classes for each chip and the global parameter for each chip of the plurality of chips;
    comparing the correlation for each of the parameter classes to identify at least one parameter class which detracts from chip yield; and
    identifying processes responsible for yield detraction based on the at least one parameter class.

11. The method as recited in claim 10, wherein the step of assigning a global parameter to each chip includes the step of analyzing the test data for all the tests to determine the global parameter for each chip.

12. The method as recited in claim 10, wherein the step of assigning a global parameter to each chip includes the steps of:
    assigning an initial global parameter based on test results of one test; and
    modifying the initial global parameter based on test results of other tests.

13. The method as recited in claim 10, wherein the step of assigning a global parameter to each chip includes the step of employing a mathematical formula for calculating the global parameter.

14. The method as recited in claim 10, wherein the step of assigning a global parameter to each chip includes the step of considering the severity of test results to modify the global parameter.

15. The method as recited in claim 10, wherein the step of assigning a global parameter to each chip includes the step of weighting the global parameter based on a test type.

16. The method as recited in claim 10, wherein the step of determining a correlation includes the step of computing a correlation coefficient for each parameter class.

17. The method as recited in claim 16, further comprising the step of eliminating from consideration parameter classes having the correlation coefficient less than a threshold value.

18. A program storage device readable by machine, tangibly embodying a program of instructions executable by the machine to perform method steps for automatically correlating yield for semiconductor chips, the method steps comprising:
    providing test data for a plurality of tests on each of a plurality of semiconductor chips;
    assigning a global parameter to each chip as a quality measure based on the test data for that chip;
    determining values for a plurality of parameter classes, each parameter class representing a parameter measured for each chip tested;
    determining a correlation between the values of the parameter classes and the global parameter for each chip of the plurality of chips; and
    comparing the correlation for each of the parameter classes to identify at least one parameter class, which detracts from chip yield.

19. The program storage device, as recited in claim 18, wherein the step of assigning a global parameter to each chip includes the step of analyzing the test data for all the tests to determine the global parameter for each chip.

20. The program storage device as recited in claim 18, wherein the step of assigning a global parameter to each chip includes the steps of:
    assigning an initial global parameter based on test results of one test; and
    modifying the initial global parameter based on test results of other tests.

21. The program storage device as recited in claim 18, wherein the step of assigning a global parameter to each chip includes the step of employing a mathematical formula for calculating the global parameter.

22. The program storage device as recited in claim 18, wherein the step of assigning a global parameter to each chip includes the step of considering the severity of test results to modify the global parameter.

23. The program storage device as recited in claim 18, wherein the step of assigning a global parameter to each chip includes the step of weighting the global parameter based on a test type.

24. The program storage device as recited in claim 18, wherein the step of determining values for a plurality of parameter classes includes measuring parameters on each chip and combining the measured parameters into a single number.

25. The program storage device as recited in claim 18, wherein the step of determining a correlation includes the step of computing a correlation coefficient for each parameter class.

26. The program storage device as recited in claim 25, further comprising the steps of eliminating from consideration parameter classes having the correlation coefficient less than a threshold value.

* * * * *